(12) United States Patent
Hu

(10) Patent No.: US 12,262,624 B2
(45) Date of Patent: Mar. 25, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Peng Hu, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/419,257

(22) PCT Filed: Apr. 20, 2021

(86) PCT No.: PCT/CN2021/088354
§ 371 (c)(1),
(2) Date: Sep. 15, 2022

(87) PCT Pub. No.: WO2022/188242
PCT Pub. Date: Sep. 15, 2022

(65) Prior Publication Data
US 2024/0032409 A1  Jan. 25, 2024

(30) Foreign Application Priority Data
Mar. 12, 2021  (CN) .......................... 202110270963.3

(51) Int. Cl.
*H10K 77/10* (2023.01)
*H10K 102/00* (2023.01)

(52) U.S. Cl.
CPC ...... *H10K 77/111* (2023.02); *H10K 2102/311* (2023.02)

(58) Field of Classification Search
CPC ................................................... H10K 77/111
(Continued)

(56) References Cited

U.S. PATENT DOCUMENTS

2017/0236877 A1* 8/2017 Jeong .................... H10K 50/16
257/40
2019/0108793 A1 4/2019 Kim
(Continued)

FOREIGN PATENT DOCUMENTS

CN   109212804 A   1/2019
CN   110867472 A   3/2020
(Continued)

*Primary Examiner* — Christopher M Raabe
(74) *Attorney, Agent, or Firm* — PV IP PC; Wei Te Chung

(57) ABSTRACT

A display panel and a display device are provided. The display panel includes a central portion having first sides and second sides alternately arranged, where each of the first sides extends in a direction away from the central portion to form a peripheral portion. The peripheral portion includes a third side and a fourth side respectively connected to both ends of a corresponding first side and extending to middle of the first side. The second side is located within a region defined by an extension line of a corresponding third side, an extension line of a corresponding fourth side, and two respective extension lines of two corresponding first sides.

21 Claims, 3 Drawing Sheets

(58) Field of Classification Search
USPC .......................................................... 349/58
See application file for complete search history.

(56) References Cited

U.S. PATENT DOCUMENTS

2019/0146548 A1* 5/2019 Li ......................... G06F 1/1637
                                                      361/679.01
2020/0379595 A1* 12/2020 Kim ......................... G09G 3/32
2021/0320275 A1* 10/2021 Cho ....................... H10K 77/00

FOREIGN PATENT DOCUMENTS

| CN | 111403453 A | 7/2020 |
| CN | 111933815 A | 11/2020 |
| CN | 112018155 A | 12/2020 |
| CN | 112071207 A | 12/2020 |
| CN | 112164331 A | 1/2021 |
| CN | 112420896 A | 2/2021 |

\* cited by examiner

DISPLAY PANEL AND DISPLAY DEVICE

RELATED APPLICATIONS

This application is a Notional Phase of PCT Patent Application No. PCT/CN2021/088354 having international filing date of Apr. 20, 2021, which claims the benefit of priority of Chinese Patent Application No. 202110270963.3 filed on Mar. 12, 2021. The contents of the above applications are all incorporated by reference as if fully set forth herein in their entirety.

FIELD OF INVENTION

The present invention relates to display technology, in particular, to manufacture of display devices, and specifically relates to a display panel and a display device.

BACKGROUND OF INVENTION

In order to cater to a screen display of multiple perspectives, electronic devices with a four-curved surface display have been launched. In the electronic device with the four-curved surface display, four parts at edges of a display panel need to be bent down to form corresponding four curved surfaces.

However, if a contoured design of traditional display panel is adopted to realize the four-curved surfaces display, wrinkling phenomenon will occur at intersection positions of two adjacent curved surfaces due to film layers overlapping. In addition, two stresses from different directions will be concentrated here, which easily causes the film layers nearby to peel off and leads to package failure.

Therefore, it is necessary to provide a display panel and a display device that can alleviate the wrinkling phenomenon occurring at the intersection position of two adjacent curved surfaces so as to alleviate a phenomenon of film layer peeling.

Technical Problem

The purpose of this application is to provide a display panel and a display device. When the central portion and the peripheral portions unfold into a plane, each of the peripheral portions is set to be located within a region jointly defined by an extension line of a corresponding first side and two extension lines of two first sides adjacent to the corresponding first side, and each of the second sides is set to be located within a region jointly defined by an extension line of a corresponding third side adjacent to the second side, an extension line of a corresponding fourth side adjacent to the second side, and two extension lines of two corresponding first sides adjacent to the second side. It solves a problem that when two adjacent edge regions of the display panel of the prior art bend, a wrinkle phenomenon occurs between the two adjacent edge regions, which causes nearby film layers to peel off

SUMMARY OF INVENTION

An embodiment of the present application provides a display panel, including: a central portion including first sides and second sides, wherein each of the second sides is connected to corresponding two adjacent first sides; and peripheral portions, wherein each of the peripheral portions extends outward from a corresponding first side of the central portion in a direction away from the central portion. Each of the peripheral portions further includes a third side and a fourth side opposite to each other, and each of the second sides is connected between a corresponding third side of one of two corresponding peripheral portions adjacent to the second side and a corresponding fourth side of the other of the two corresponding peripheral portions.

Wherein, when the central portion and the peripheral portions unfold into a plane, each of the peripheral portions is located within a region jointly defined by an extension line of a corresponding first side and extension lines of two first sides adjacent to the corresponding first side, and each of the second sides is located within a region jointly defined by an extension line of a corresponding third side adjacent to the second side, an extension line of a corresponding fourth side adjacent to the second side, and two extension lines of two corresponding first sides adjacent to the second side.

Wherein, the second sides are curved, and a convex direction of each of the second sides away from a center of the central portion, where each of the peripheral portions further includes a fifth side disposed opposite to the corresponding first side, and a length of the fifth side is less than a length of the corresponding first side.

In one embodiment, the second side is arc-shaped.

In one embodiment, a central angle corresponding to the second side is 90°.

In one embodiment, at least one of the third side or the fourth side is curved, and a convex direction of at least one of the third side or the fourth side is away from the center of the central portion.

In one embodiment, at least one of the third side or the fourth side is arc-shaped.

In one embodiment, a central angle corresponding to at least one of the third side or the fourth side is less than 90°.

In one embodiment, a size of each of the peripheral portions gradually decreases from the corresponding first side in a direction away from the central portion.

An embodiment of the present application further provides a display panel, including: a central portion including first sides and second sides, wherein each of the second sides is connected to corresponding two adjacent first sides; peripheral portions, wherein each of the peripheral portions extends outward from a corresponding first side of the central portion in a direction away from the central portion, each of the peripheral portions further includes a third side and a fourth side arranged oppositely, and each of the second sides is connected between a corresponding third side of one of two corresponding peripheral portions adjacent to the second side and a corresponding fourth side of the other of the two corresponding peripheral portions; wherein, when the central portion and the peripheral portions unfold into a plane, each of the peripheral portions is located within a region jointly defined by an extension line of the corresponding first side and two extension lines of two first sides adjacent to the corresponding first side, and each of the second sides is located within a region jointly defined by an extension line of a corresponding third side adjacent to the second side, an extension line of a corresponding fourth side adjacent to the second side, and two extension lines of two corresponding first sides adjacent to the second side.

In one embodiment, the second side is curved, and a convex direction of the second side is away from a center of the central portion.

In one embodiment, the second side is arc-shaped.

In one embodiment, a central angle corresponding to the second side is 90°.

In one embodiment, at least one of the third side or the fourth side is curved, and a convex direction of at least one of the third side or the fourth side is away from the center of the central portion.

In one embodiment, at least one of the third side or the fourth side is arc-shaped.

In one embodiment, a central angle corresponding to at least one of the third side or the fourth side is less than 90°.

In one embodiment, each of the peripheral portions further includes a fifth side disposed opposite to the corresponding first side, and a length of the fifth side is less than a length of the corresponding first side.

In one embodiment, a size of each of the peripheral portions gradually decreases from the corresponding first side in a direction away from the central portion.

In one embodiment, both ends of the fifth side do not exceed both ends of a corresponding first side.

In one embodiment, at least one of the peripheral portions is provided with a virtual key.

In one embodiment, the display panel includes: a display film layer including the central portion and the peripheral portions; a cover plate disposed on the display film layer, wherein the cover plate includes a central region and peripheral regions, the central region is arranged corresponding to the central portion, and each of the peripheral regions is arranged corresponding to a corresponding peripheral portion.

An embodiment of the present application provides a display device including the display panel described above.

Beneficial Effect

A display panel and a display device are provided. The display panel includes a central portion and a plurality of peripheral portions, the central portion includes a plurality of first sides and a plurality of second sides, wherein each of the second sides is connected to corresponding two adjacent first sides. Each of the peripheral portions extends outward from a corresponding first side of the central portion in a direction away from the central portion. Each of the peripheral portions further includes a third side and a fourth side opposite to each other, and each of the second sides is connected between a corresponding third side of one of two corresponding peripheral portions adjacent to the second side and a corresponding fourth side of the other of the two corresponding peripheral portions. When the central portion and the peripheral portions unfold into a plane, each of the peripheral portions is set to be located within a region jointly defined by an extension line of a corresponding first side and two extension lines of another two first sides adjacent to the corresponding first side to ensure that when the adjacent peripheral portions of the display panel bend along the lines of the first sides, the adjacent peripheral portions will not overlap, and each of the second sides is set to be located within a region jointly defined by an extension line of a corresponding third side adjacent to the second side, an extension line of a corresponding fourth side adjacent to the second side, and two extension lines of two corresponding first sides adjacent to the second side to ensure that the second sides of the central portion will not overlap with the peripheral portions when the display panel bends downward along the lines to which the first sides belong. As mentioned above, this solution can alleviate a wrinkling phenomenon that occurs in a peripheral region of the display panel when bending and further alleviates a phenomenon that film layers peel off in the peripheral region of the display panel.

DESCRIPTION OF DRAWINGS

The following describes the specific implementations of the present application in detail with the accompanying drawings, so as to make the technical solutions and other beneficial effects of the present application easy to understand.

DETAILED DESCRIPTION OF PREFERRED EMBODIMENTS

Figure 1:
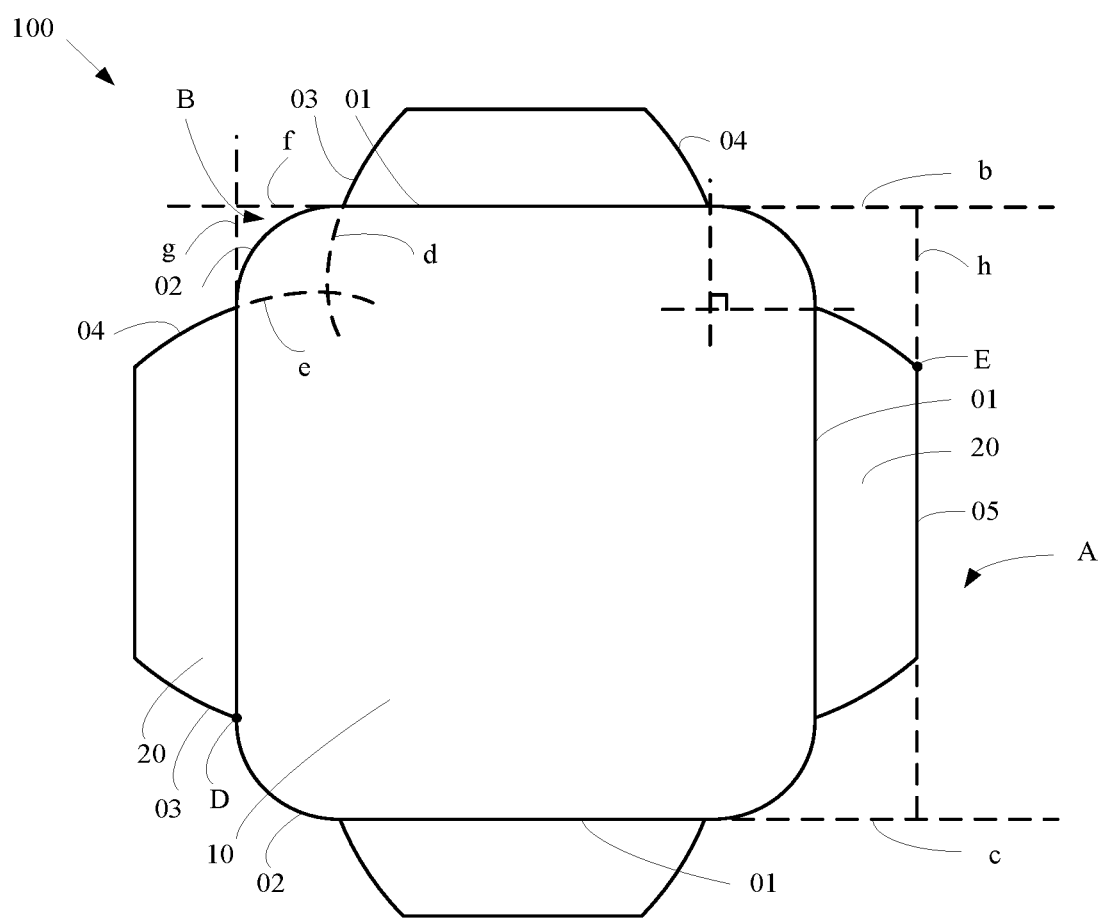
FIG. 1 is a schematic plan view of an unfolded display panel provided by an embodiment of the application.

The following describes the technical solutions in the embodiments of the present application clearly and completely with reference to the drawings in the embodiments of the present application. Obviously, the embodiments are only a part of the embodiments of the present application, rather than all the embodiments. Based on the embodiments in this application, all other embodiments obtained by those skilled in the art without creative work shall fall within the protection scope of this application.

In the description of this application, it should be noted that the orientation or positional relationship indicated by the terms "above "adjacent", "opposite", etc. are based on the orientation or positional relationship shown in the drawings. For example, "above" simply means above the object, and specifically refers to directly above, diagonally above, or an upper surface, as long as it is above the level of the object. The orientation or positional relationship is only for the convenience of describing the application and simplifying the description, rather than indicating or implying that the device or element referred to must have a specific orientation, be constructed and operated in a specific orientation, and therefore cannot be understood as a limitation of the application. In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present application, "plurality" means two or more than two, unless otherwise specifically defined.

In addition, it should be noted that the drawings only provide structures closely related to this application, and some less important details are omitted for the purpose of simplifying the drawings and making the points of the invention clear, rather than showing that the actual device is the same as the drawings. The drawings are not meant to limit the actual device.

The present application provides a display panel, and the display panel includes but is not limited to the following embodiments or a combination thereof.

Figure 2:
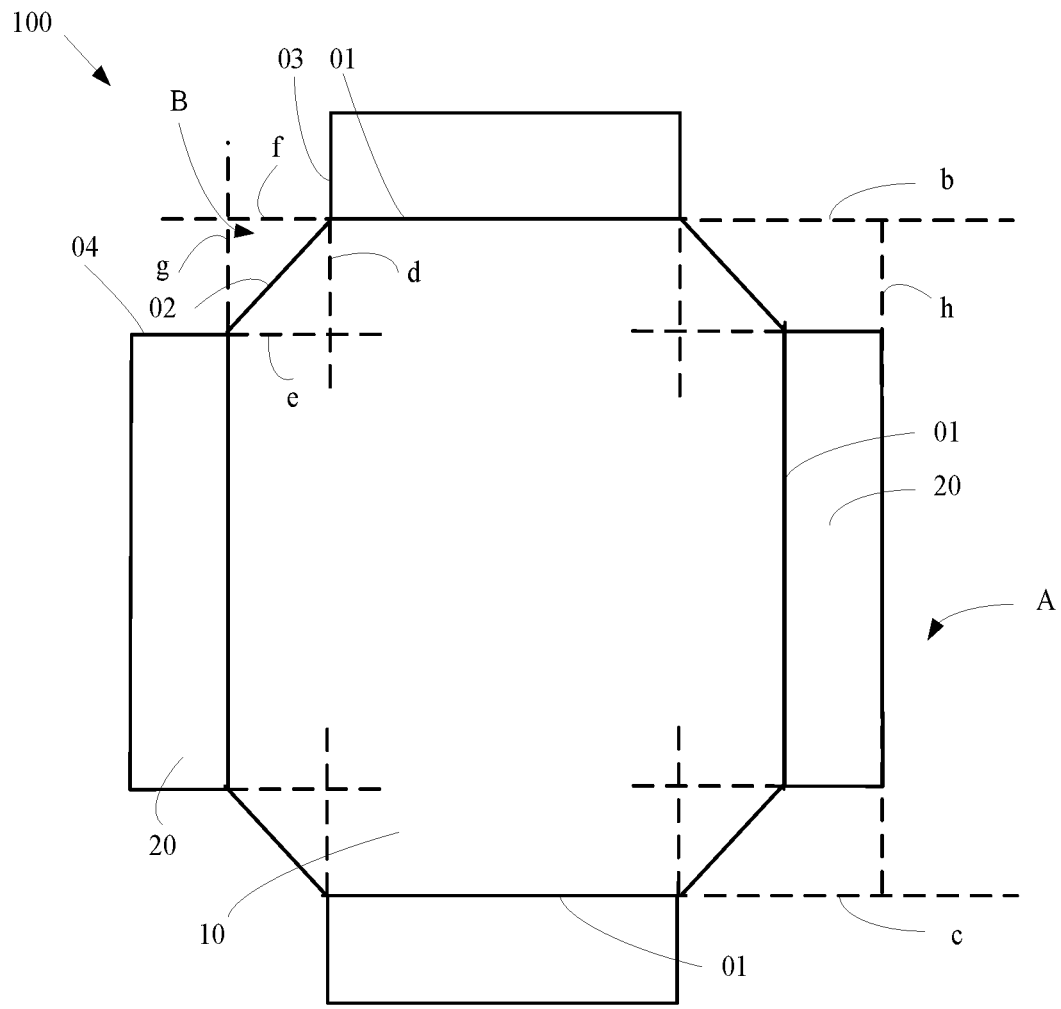
FIG. 2 is a schematic plan view of another unfolded display panel according to an embodiment of the application.
Figure 3:
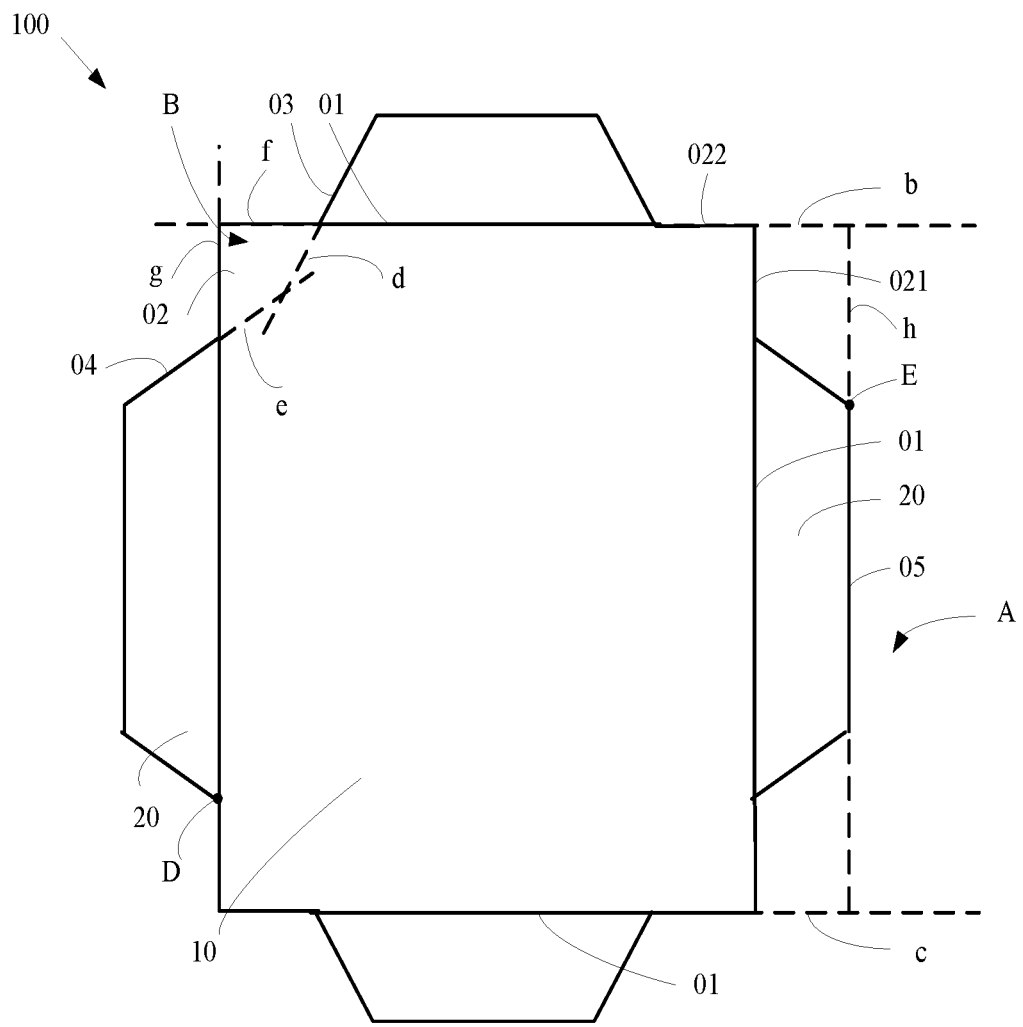
FIG. 3 is a schematic plan view of yet another unfolded display panel according to an embodiment of the application.

In one embodiment, as shown in FIG. 1 to FIG. 3, the display panel 100 includes: a central portion 10 having a plurality of first sides 01 and a plurality of second sides 02, wherein each of the second sides 02 is connected to corresponding two adjacent first sides 01; and a plurality of peripheral portions 20, wherein each of the peripheral portions 20 extends outward from a corresponding first side 01 of the central portion 10 in a direction away from the central portion 10. Each of the peripheral portions 20 further includes a third side 03 and a fourth side 04 opposite to each other, and each of the second sides 02 is connected between a corresponding third side 03 of one of two corresponding peripheral portions 20 adjacent to the second side 02 and a corresponding fourth side 04 of the other of the two corresponding peripheral portions Wherein, when the central portion 10 and the peripheral portions 20 unfold into a plane, each of the peripheral portions 20 is located within a region A jointly defined by an extension line of the corresponding first side 01 and respective two extension lines b and c of the two first sides 01 adjacent to the corresponding first side 01, and each of the second sides 02 is located within a region B jointly defined by an extension line d of a corresponding third side 03 adjacent to the second side 02, an extension line e of a corresponding fourth side 04 adjacent to the second side 02, and respective two extension lines f and g of two corresponding first sides 01 adjacent to the second side 02.

Specifically, the shapes of the first sides 01 may be the same or different, and the shapes of the second sides 02 may be the same or different. The shapes of the third sides 03 may be the same or different, and the shapes of the fourth sides 04 may be the same or different. In this embodiment, the specific shapes of the first sides 01, the second sides 02, the third sides 03, and the fourth sides 04 are not limited. The shapes of the first side 01, the second side 02, the third side 03, and the fourth side 04 have no specific relationship, and the shapes of the four can be combined arbitrarily. Further, the numbers of the first sides 01, the second sides 02, the third sides 03, and the fourth sides 04 are not limited. Understandably, it is only required that the relative positional relationships of the first sides 01, the second sides 02, the third sides 03, and the fourth sides 04 meet the foregoing requirements. Here, the description is made by taking as an example that the first sides 01 are all straight segments, and the angle formed by the intersection of two adjacent extension lines of the first sides 01 is 90°. It should be noted that each peripheral portion 20 includes at least one corresponding first side 01, one corresponding third side 03, and one corresponding fourth side 04.

On one hand, as shown in FIG. 1 to FIG. 3, when the central portion 10 and the peripheral portions 20 unfold into a plane, each of the peripheral portions 20 extends outward from a corresponding first side 01 in a direction away from the central portion That is, each of the peripheral portion 20 must also be positioned between the corresponding first side 01 and a corresponding outer edge h of the display panel 100. Therefore, region A is a region jointly defined by a corresponding first side 01, a corresponding extension line b, a corresponding extension line c, and a corresponding outer edge h. It is understandable that each of the peripheral portions 20 does not exceed the corresponding extension line b and the corresponding extension line c so that when two adjacent peripheral portions 20 of the display panel 100 bends downward along the first sides 01 thereof, the two adjacent peripheral portions 20 will not overlap and cause wrinkles.

On the other hand, as shown in FIG. 1 to FIG. 3, when the central portion 10 and the peripheral portions 20 unfold into a plane, an extension line d of the third side 03 corresponding to each of the second sides 02 intersects the extension line e of the corresponding fourth side 04, and the two corresponding extension lines f and g of the first side 01 intersect, that is, the four extension lines d, e, f, and g jointly define the region B. First, take the extension lines f and g as two boundaries of the region B. When the display panel 100 bends downward along corresponding straight lines of two adjacent first sides 01, the central portion 10 does not overlap and causes wrinkles. Secondly, take the extension lines d and e as the other two boundaries of region B, an area between the two adjacent first sides 01 can be effectively increased to increase the display area of the central portion 10 and increase the screen-to-body ratio of the display panel 100.

In one embodiment, as shown in FIG. 1, the second side 02 is curved, and a convex direction of the second side 02 is away from the center of the central portion 10. It is understandable that, on the basis of taking the extension lines d and e as the other two boundaries of the region B, the second side 02 is set to be a curved shape with a convex direction away from the center of the central portion 10. It is possible to further increase the area of the region of the display panel 100 located between the corresponding two adjacent first sides 01, and the acute angles of the display panel 100 can be alleviated by setting the second side 02 in a curved shape, so as to improve the aesthetics and visual effect. It can also reduce the difficulty of forming the second side 02 by laser cutting, and prevent the decrease in yield due to sudden changes in the traveling angle of laser cutting.

Certainly, as shown in FIG. 2, the second side 02 can also be a straight line, that is, laser cutting can be performed along a straight path from one of endpoints of a corresponding peripheral portion 20 to the other endpoint of the corresponding peripheral portion 20 to form the second side 02. This can further reduce the difficulty of the laser cutting to form the second side 02. Certainly, the second side 02 can also be a curved line with a convex direction close to the center of the central portion 10, or the second side 02 may also include at least one curved section and at least one straight section. As long as the second side 02 is located in region B, the peripheral region of the display panel 100 can be prevented from wrinkling during bending. This further alleviates the phenomenon of film layer peeling in the peripheral region of the display panel 100. Alternately, as shown in FIG. 3, each second side 02 may include a first sub-side 021 and a second sub-side 022. Specifically, the extension lines g and f of two adjacent first sides 01 may overlap with the first sub-side 021 and the second sub-side 022 of the second side 02 located between the two adjacent first sides 01, that is, the second side 02 may be formed by the intersection of the extension lines f and g of the two corresponding first sides 01. It is understandable that the second side 02 in this embodiment is still located in region B, and the second side 02 overlaps the extension lines f and g, which can maximize the display area of the central portion 10 in the display panel 100 to increase the screen-to-body ratio of the display panel 100.

In one embodiment, as shown in FIG. 1, the second side 02 is arc-shaped. It is understandable that, compared to the second side 02 being set to other curved shapes, the second side 02 set to be an arc-shaped can make the second side 02 have a constant curvature to improve the fluency and continuity of the second side 02. This can further realize an ultra-wide-angle display to improve the aesthetics and visual effects of the display panel 100 and allows the laser to cut at a constant rate of change in direction. This effectively reduces the difficulty of laser cutting to form the second side 02 and also effectively prevents sudden changes in the angle of travel of laser cutting to reduce yield. Further, in one embodiment, as shown in FIG. 1, the central angle corresponding to the second side 02 is 90°. Specifically, the angle formed by the intersection of the respective extension lines of the two adjacent first sides 01 in the display panel 100 may be set to 90° to set the outline of the central portion 10 to be approximately rectangular. Further, the central angle corresponding to the arc-shaped second side 02 is set to 90°, so that the shape of the second side 02 is approximately a corner of a rectangle, that is, the second side 02 may be tangent to two extension lines f and g of two corresponding adjacent first sides 01. Therefore, the screen-to-body ratio of the display panel 100 can be increased while maintaining the aesthetics and visual effects of the display panel 100. Certainly, the central angle corresponding to the second side 02 can also be set to other angles according to the angle between two adjacent first sides 01 and the arc length requirements of the second side 02.

In one embodiment, as shown in FIG. 1, at least one of the third side 03 or the fourth side 04 is curved, and a convex direction of at least one of the third side 03 or the fourth side 04 is away from the center of the central portion 10. On one hand, under the premise that the second side 02 is a curved line with a convex direction away from the center of the central portion 10, a convex direction of at least one of the third side 03 or the fourth side 04 is also set to be away from the center of the central portion 10. The display panel 100 can be made into a convex shape as a whole to unify the boundary shape of the display panel 100, so as to achieve an ultra-wide-angle display to improve the aesthetics and visual effects of the display panel 100 and prevent serious picture loss due to large border differences. On the other hand, intersection point D is a point formed by an intersection of the third side 03 and the second side 02. When the third side 03 and the second side 02 are both a curved line with a convex direction away from the center of the central portion 10, two parts of the third side and the corresponding second side respectively close to the intersection point D protrude from the intersection point D so that a concave portion with two convex sides is formed at the intersection point D. When the third side 03 breaks, a crack that extends through the intersection point D can be blocked by the concave portion at the intersection point D so the crack cannot extend smoothly and transition to the second side 02. That is, it can prevent the crack from extending to the second side 02. When the second side 02 breaks, a crack that extends through the intersection point D can be blocked by the concave portion at the intersection point D so the crack cannot extend smoothly and transition to the third side 03. That is, it can prevent the crack from extending to the third side 03, which alleviates the phenomenon of film layer peeling in the region around the display panel 100.

Certainly, as shown in FIG. 2 and FIG. 3, the third side 03 and the fourth side 04 can be straight segments, which can facilitate laser cutting. Further, as shown in FIG. 2, the shape of each peripheral portion 20 may be a rectangle extending from the corresponding first side 01 of the central portion 10 in a direction away from the central portion 10. In this way, the area of the peripheral portion 20 can be increased while preventing wrinkles caused by bending, so as to increase the screen-to-body ratio of the display panel 100.

In one embodiment, as shown in FIG. 1, at least one of the third side 03 or the fourth side 04 is arc-shaped. According to the above analysis, for example, compared to the third side 03 being set to other curved shapes, setting the third side 03 in an arc-shaped can make the third side 03 have a constant curvature to improve the fluency and continuity of the third side 03, which can further realize an ultra-wide-angle display to improve the aesthetics and visual effects of the display panel 100 and allows the laser cutting to perform at a constant rate of change in directions. It effectively reduces the difficulty of laser cutting to form the third side 03, and also effectively prevents sudden changes in the angle of laser travel when performing laser cutting, which reduces the yield. It should be noted that the position of the center of circle corresponding to the third side 03 is not limited here, that is, the center of circle can be located in the central portion 10 or the corresponding peripheral portion 20, as long as each peripheral portion 20 is located within the corresponding region A. Further, the third side 03 and the fourth side 04 may both be arc-shaped. Further, in order to reduce the interference between two adjacent peripheral portions 20, both the center of circle corresponding to the third side 03 and the center of circle corresponding to the fourth side 04 can be located in the central portion 10, that is, the third side 03 gradually moves away from the corresponding second side 02 from the corresponding first side 01 in a direction away from the central portion 10. Similarly, the fourth side 04 gradually moves away from the corresponding second side 02 from the corresponding first side 01 in a direction away from the central portion 10.

In one embodiment, as shown in FIG. 1, the central angle corresponding to at least one of the third side 03 or the fourth side 04 is less than 90°. Understandably, on the basis that both the center of circle corresponding to the third side 03 and the center of circle corresponding to the fourth side 04 can be located in the central portion 10, if the central angle corresponding to the third side 03 is larger, the direction of the third side 03 will change too quickly. It will further cause the length of the third side 03 to be too long so that the intersection E of the third side 03 and the corresponding outer edge h of the display panel 100 is too close to the center of the central portion 10. As a result, the length of the fifth side 05 disposed opposite to the corresponding first side 01 in the corresponding peripheral portion 20 is too short, so that the area of the corresponding peripheral portion 20 is too small. Therefore, setting the central angle corresponding to the third side 03 to be less than 90° can effectively reduce the length of the third side 03 so as to increase the length of the fifth side 05 of the corresponding peripheral portion 20. Thus, the area of the corresponding peripheral portion 20 is increased to increase the screen-to-body ratio of the display panel 100.

In one embodiment, as shown in FIG. 1 and FIG. 3, the length of each fifth side 05 is less than the length of the corresponding first side 01. Understandably, no matter what the specific shapes of the third side 03 and the fourth side 04 are, because the length of each fifth side 05 is less than the length of the corresponding first side 01, at least one of the third side 03 or the fourth side 04 meets a requirement of "from the corresponding first side 01 in a direction away from the central portion 10 gradually away from the corresponding second side 02". On one hand, according to the above analysis, the interference between two adjacent peripheral portions 20 can be effectively reduced. On the other hand, the size of each of the peripheral portions 20 as a whole from the corresponding first side 01 in a direction away from the central portion is decreasing, so that when the cover plate is attached to the display panel 100, air bubbles need to be squeezed out from the central portion 10 to the peripheral portions and from the first side 01 to the corresponding outer edge h, which facilitates the discharge of the air bubbles from at least one of the third side 03 or the fourth side 04 and prevents the accumulation of the air bubbles.

Specifically, as shown in FIG. 1 and FIG. 3, the size of each of the peripheral portions 20 gradually decreases from a corresponding first side 01 in a direction away from the central portion 10. Understandably, on the basis that the length of the fifth side of each of the peripheral portions 20 is less than the length of the corresponding first side 01, if each of the peripheral portions 20 is cut into long strips of equal width in a direction from a corresponding first side 01 in a direction away from the central portion then in every two adjacent strips, the length of the strip far away from the central portion 10 is less than the length of the strip close to the central portion 10. It is more conducive for air bubbles to be discharged from at least one of the third side 03 or the fourth side 04 to prevent the accumulation of air bubbles. Specifically, as shown in FIG. 1 and FIG. 3, the two ends of the fifth side 05 in each of the peripheral portions 20 do not exceed the range of the two ends of the corresponding first side 01. It is understandable that no matter what the specific shapes of the third side 03 and the fourth side 04 are, as long as both ends of the fifth side 05 of the peripheral portion 20 do not exceed the range of the two ends of the corresponding first side 01, the bubbles can be discharged from the third side 03 and the fourth side 04.

In one embodiment, at least one of the peripheral portions 20 is provided with virtual keys, wherein, the number of the virtual key is at least one. For example, when the display panel 100 performs imaging display, the user can touch the central portion or the peripheral portion 20 to make the peripheral portion 20 present the virtual key. Further, the user can touch a corresponding virtual key to realize a corresponding function.

In one embodiment, the display panel 00 includes a display film layer and a cover plate. The display film layer includes the central portion 10 and a plurality of the peripheral portions 20. The cover plate is disposed on the display film layer to encapsulate the display film layer. The cover plate includes a central region and a plurality of peripheral regions, and the central region is arranged corresponding to the central portion 10 to cover the central portion 10. Each of the peripheral regions are arranged corresponding to each of the peripheral portions 20 to cover the corresponding peripheral portions 20. Further, the display panel 00 is an organic light-emitting diode (OLED) display panel.

A display panel and a display device are provided. The display panel includes a central portion and a plurality of peripheral portions. The central portion includes a plurality of first sides and a plurality of second sides, wherein each of the second sides is connected to corresponding two adjacent first sides. Each of the peripheral portions extends outward from a corresponding first side of the central portion in a direction away from the central portion. Each of the peripheral portions further includes a third side and a fourth side arranged oppositely, and each of the second sides is connected between a corresponding third side of one of two corresponding peripheral portions adjacent to the second side and a corresponding fourth side of the other of the two corresponding peripheral portions. When the central portion and the peripheral portions unfold into a plane, each of the peripheral portions is set to be located within a region jointly defined by an extension line of the corresponding first side and two extension lines of two first sides adjacent to the corresponding first side, so as to ensure that when the display panel bends downward along the line to which the two adjacent first sides belong, the corresponding two adjacent peripheral portions will not be overlapped, and each of the second sides is located within a region jointly defined by an extension line of a corresponding third side adjacent to the second side, an extension line of a corresponding fourth side adjacent to the second side, and two extension lines of two corresponding first sides adjacent to the second side, to ensure that when the display panel bends downward along the line to which the first side belongs, the film layer at the central portion does not overlap. As described above, this solution can alleviate the wrinkles phenomenon in the region around the display panel when it bends, and further alleviates the phenomenon of film peeling in the region around the display panel.

The display panel and the display device provided by the embodiments of the present application are described in detail above. Specific embodiments are used in this article to describe the principle and implementation of this application. The embodiments are only used to help understand the technical solutions and core ideas of this application. Those of ordinary skill in the art should understand that it is possible to modify the technical solutions in the embodiments, or equivalently replace some of the technical features. However, these modifications or replacements do not cause the essence of the technical solutions to deviate from the scope of the technical solutions disclosed in the embodiments of the present application.

What is claimed is:

1. A display panel, comprising:
a central portion comprising first sides and second sides, wherein each of the second sides is connected to corresponding two adjacent first sides;
peripheral portions, wherein each of the peripheral portions extends outward from a corresponding first side of the central portion in a direction away from the central portion, each of the peripheral portions further comprises a third side and a fourth side arranged oppositely, and each of the second sides is connected between a corresponding third side of one of two corresponding peripheral portions adjacent to the second side and a corresponding fourth side of the other of the two corresponding peripheral portions;
wherein, when the central portion and the peripheral portions unfold into a plane, each of the peripheral portions is located within a region jointly defined by an extension line of a corresponding first side and two extension lines of another two first sides adjacent to the corresponding first side, and each of the second sides is located within a region jointly defined by an extension line of a corresponding third side adjacent to the second side, an extension line of a corresponding fourth side adjacent to the second side, and two extension lines of two corresponding first sides adjacent to the second side; and
wherein the second side comprises a straight section.

2. The display panel according to claim 1, wherein at least one of the peripheral portions is provided with a virtual key.

3. The display panel according to claim 1, further comprising:
a display film layer comprising the central portion and the peripheral portions;
a cover plate disposed on the display film layer, wherein the cover plate comprises a central region and peripheral regions, the central region is arranged corresponding to the central portion, and each of the peripheral regions is arranged corresponding to a corresponding peripheral portion.

4. A display device, comprising the display panel according to claim 1.

5. The display panel according to claim 1, wherein the second side is a straight line.

6. The display panel according to claim 1, wherein the second side comprises a first sub-side and a second sub-side, each of the first sub-side and the second sub-side is a straight line.

7. The display panel according to claim 6, wherein extension lines of two adjacent ones of the first sides overlap with the first sub-side and the second sub-side of the second side located between the two adjacent ones of the first sides.

8. The display panel according to claim 1, wherein the second side comprises at least one curved section and at least one straight section.

9. The display panel according to claim 1, wherein the third side and/or the fourth side comprises a straight segment.

10. The display panel according to claim 9, wherein the third side and/or the fourth side is a straight line.

11. The display panel according to claim 10, wherein each of the peripheral portions further comprises a fifth side disposed opposite to the corresponding first side, and a length of the fifth side is less than a length of the corresponding first side.

12. The display panel according to claim 11, wherein a size of each of the peripheral portions gradually decreases from the corresponding first side in the direction away from the central portion.

13. The display panel according to claim 10, wherein each of the peripheral portions further comprises a fifth side disposed opposite to the corresponding first side, and a length of the fifth side is equal to a length of the corresponding first side.

14. A display panel, comprising:
a central portion comprising first sides and second sides, wherein each of the second sides is connected to corresponding two adjacent first sides;
peripheral portions, wherein each of the peripheral portions extends outward from a corresponding first side of the central portion in a direction away from the central portion, each of the peripheral portions further comprises a third side and a fourth side arranged oppositely, and each of the second sides is connected between a corresponding third side of one of two corresponding peripheral portions adjacent to the second side and a corresponding fourth side of the other of the two corresponding peripheral portions;
wherein, when the central portion and the peripheral portions unfold into a plane, each of the peripheral portions is located within a region jointly defined by an extension line of a corresponding first side and two extension lines of another two first sides adjacent to the corresponding first side, and each of the second sides is located within a region jointly defined by an extension line of a corresponding third side adjacent to the second side, an extension line of a corresponding fourth side adjacent to the second side, and two extension lines of two corresponding first sides adjacent to the second side; and
wherein the third side and/or the fourth side comprises a straight segment.

15. The display panel according to claim 14, wherein the third side and/or the fourth side is a straight line.

16. The display panel according to claim 15, wherein each of the peripheral portions further comprises a fifth side disposed opposite to the corresponding first side, and a length of the fifth side is less than a length of the corresponding first side.

17. The display panel according to claim 16, wherein a size of each of the peripheral portions gradually decreases from the corresponding first side in the direction away from the central portion.

18. The display panel according to claim 15, wherein each of the peripheral portions further comprises a fifth side disposed opposite to the corresponding first side, and a length of the fifth side is equal to a length of the corresponding first side.

19. The display panel according to claim 14, wherein the second side is a straight line.

20. The display panel according to claim 14, wherein the second side comprises a first sub-side and a second sub-side, each of the first sub-side and the second sub-side is a straight line.

21. The display panel according to claim 20, wherein extension lines of two adjacent ones of the first sides overlap with the first sub-side and the second sub-side of the second side located between the two adjacent ones of the first sides.

* * * * *